United States Patent [19]
Kanithi

[11] Patent Number: 5,088,183
[45] Date of Patent: Feb. 18, 1992

[54] PROCESS FOR PRODUCING FINE AND ULTRAFINE FILAMENT SUPERCONDUCTOR WIRE

[76] Inventor: Hem C. Kanithi, 15 Briar Ct., Chesire, Conn. 06410

[21] Appl. No.: 517,351

[22] Filed: May 1, 1990

[51] Int. Cl.⁵ .............................. H01L 39/24
[52] U.S. Cl. ........................... 29/599; 505/928; 505/929; 505/930
[58] Field of Search ............... 29/599; 505/928, 929, 505/930

[56] References Cited

U.S. PATENT DOCUMENTS

| | | | |
|---|---|---|---|
| 3,277,564 | 10/1966 | Webber et al. | 29/599 X |
| 3,618,205 | 11/1971 | Barber et al. | 29/599 |
| 3,710,000 | 1/1973 | Shattes et al. | 29/599 X |
| 3,958,327 | 5/1976 | Marancik et al. | 29/599 |
| 4,044,457 | 8/1977 | Strauss et al. | 29/599 |
| 4,411,712 | 10/1983 | Marancik | 29/599 X |
| 4,490,439 | 12/1984 | Stekly et al. | 29/599 X |
| 4,723,355 | 2/1988 | Both et al. | 29/599 |
| 4,959,279 | 9/1990 | Tanaka et al. | 29/599 |

Primary Examiner—Carl J. Arbes
Attorney, Agent, or Firm—Helfgott & Karas

[57] ABSTRACT

A process for producing a superconductor wire made up of a large number of round monofilament rods is provided for, comprising assembling a multiplicity of round monofilaments inside each of a multiplicity of thin wall hexagonal tubes and then assembling a number of said thin wall hexagonal tubes within an extrusion can and subsequently consolidating, extruding and drawing the entire assembly down to the desired wire size.

18 Claims, 3 Drawing Sheets

PROCESS FOR PRODUCING FINE AND ULTRAFINE FILAMENT SUPERCONDUCTOR WIRE

This invention was made with Government support under Contract No. DE-AC02-89ER80774 awarded by the Department of Energy. The Government has certain rights in this invention.

FIELD OF THE INVENTION

This invention relates to superconductor wire made up of a large number of round monofilament rods and more particularly to a process for the production of fine and ultrafine multifilamentary superconductor wire of high quality and at lower cost than has been heretofore possible.

BACKGROUND OF THE INVENTION

For accelerator magnet applications such as the Superconducting Super Collider (SSC) fine filament NbTi superconducting wire is required to minimize distortion of the magnetic fields associated with particle injection. The magnetization of the filaments gives rise to these distortions. The magnetization is proportional to the critical current density (Jc), the volume fraction of NbTi and the filament diameter. The volume fraction of NbTi is usually fixed because of magnet operating current and stability requirements. To minimize the fraction of expensive NbTi, the Jc has to be as high as possible. Therefore, to minimize magnetization the filament diameter has to be as small as possible. Preliminary indications are that filaments 2 microns in diameter would require no correction field windings in the dipole magnets, resulting in a significant reduction in the cost of a giant accelerator.

A significant problem in the production of large quantities of this type of conductor are that so many 2 micron diameter filaments are required to obtain the necessary volume fraction of NbTi. Between 40,000 and 70,000 filaments would be required in such conductors. The manufacture of these conductors normally requires expensive multiple extrusion steps.

As smaller and smaller filaments are produced, they tend to deform non-uniformly leading to filament necking or sausaging. This results in a rapid degradation of obtainable Jc. As interfilament spacing is decreased or as the interfilament material strength is increased, the filament sausaging problem is resolved. However, if the filaments become too close, electrical coupling will result, necessitating the use of costly correction coils. Alternate interfilament matrix materials such as copper-nickel and manganese-doped barriers have to be developed to a point when they can be incorporated practically into an ultrafine filament conductor design. This matrix material change has to be implemented with minimum compromise to the electrical stability of the conductor, presently being provided by the high purity copper matrix.

An interest in ultrafine filament conductors has existed for as long as certain applications of superconductivity, such as A.C. devices and accelerator magnets, have been under consideration. The production of such conductors has been undertaken in response to these needs with varying degrees of success. In 1986, P. Dubots et al., "NbTi Ultra Fine Filament Wires for 50/60 Hertz Use," Adv. in Cryo. Eng. Mtls., Ed. R.P. Reed and A.F. Clark, Vol. 32 Plenum Press, N.Y., 1986, pp. 747, reported on their filaments no less than 1 micron in diameter. However, the Jc of the wire was not anywhere near the values being obtained for well optimized, larger filament conductors. In 1986, for SSC conductor research and development, Intermagnetics General Corp. (IGC) produced SSC inner grade conductor with 2.7 micron filaments (See: C.G. King et al., "Fabrication and Characterization of Fine Filaments of NbTi in Copper Matrix", Adv. in Cryo. Eng. Mtls., Ed. R.P. Reed and A.F. Clark, Vol. 32 Plenum Press, N.Y., 1986 pp. 731, and "Prototype Fabrication of UltraFine Filament NbTi Conductors for SSC", IEEE Trans. on Magnetics, Vol. MAG-23, No. 2, pp. 1351, March 1987.) This conductor had a Jc of 2400 A/mm$^2$ at 5T, but filament quality was poor, the wire was brittle and the filaments were magnetically coupled. Poor filament quality was determined to be a result of the relatively small number of filaments used in the first extrusion step of the multistep extrusion process used to produce the conductor, that is, the multifilament restack element. The brittle wire was also a result of the conductor geometry, as well as the initial processing variables for the billet, such as, the cold worked state of the alloy, barrier integrity and its bond quality. The coupled filaments were due to the small interfilament spacing in the final size conductor and the lack of an appropriate interfilament matrix material.

Rather than complicate the conductor design with the incorporation of resistive interfilament matrix materials for decoupling of the filaments, it was instead decided to produce 5 micron filament diameter conductor via a single stack multifilament extrusion process and concentrate on cost reduction by obtaining higher current density wire. Significant progress has been made in Jc's of today's production SSC conductors exceeding 3000 A/mm$^2$ at 5T as compared to 2200 A/mm$^2$ at 5T in the best Fermi Tevatron conductors.

In another approach and following the suggestion of E.W. Collings, "Stabilizer Design Considerations in Fine Filament Cu/NbTi Composites", Adv. in Cryo. Eng., Eds. A.F. Clark and R.P. Reed, Plenum Press, New York, Vol. 34, pp. 867–878, 1988, E. Gregory et al., (See: "A Conductor With Uncoupled 2.5 Micron Diameter Filaments, Designed for the Outer Cable of SSC Dipole Magnets", IEEE Trans. on Magnetics, Vol. 25, No. 2, pp. 1926, 1989), has doped the interfilament copper matrix with 0.5 wt% manganese. Due to electron-spin-flip scattering by manganese, the filament coupling was shown to be eliminated for filament sizes down to 1.5 microns corresponding to a filament spacing of approximately 0.3 microns. Here large numbers (22,900 & 40,000) of very fine hex shaped monofilament were used which is impractical for large scale production of ultrafine filament conductors. Gregory et al.,s method produced a 5T Jc of 2156 A/mm$^2$. This value is far from the 2750–3000 range necessary for SSC type superconductors. The "n" value was reported at 13 suggesting poor filament uniformity, which is unacceptable for the intended application.

Since the use of fine filament conductors in some specialized areas of the SSC, in future accelerator applications and A.C. motors and generators could result in a significant cost savings, there is still an opportunity to develop cost effective production techniques aimed at high Jc and n values.

While the foregoing discussion specifically related to multifilament rods of NbTi, it should be appreciated that there is a general need for a multifilament billet having large numbers of rods for various superconductor applications. For example, there is a need for a multifilament billet of Nb3Sn type conductors, and others like it.

SUMMARY OF THE INVENTION

Accordingly, it is an object of the present invention to provide a process for manufacturing a superconductor wire at lower cost than has heretofore been possible.

A further object of the present invention is to provide a process for producing a superconductor wire having a large number of fine and ultrafine filaments which do not suffer from the defects brought about by coupling of adjacent filaments.

Another object of the present invention is to provide a process for producing a superconductor wire having a large number of fine and ultrafine filaments which is suitable for large scale production of such wire.

Briefly, in accordance with the present invention, there is provided a process for producing a superconductor wire made up of a large number of round monofilament rods, wherein a group of round monofilament rods are first assembled inside thin walled hexagonal tubes. A plurality of these tubes are then arranged inside of an extrusion can, which is then consolidated, extruded and drawn down to the final desired size.

The aforementioned objects, features and advantages of the invention will, in part, be pointed out with particularity, and will, in part, become obvious from the following more detailed description of the invention, taken in conjunction with the accompanying drawing which forms an integral part thereof.

BRIEF DESCRIPTION OF THE DRAWING

In the drawing.

In the various figures of the drawing like reference characters designate like parts.

DISCUSSION OF THE INVENTION

Tens of thousands of filaments are required for SSC size strands if the filament diameter were to be in the 2 to 3 micron range. This many filaments can, practically, be incorporated in a strand by multiple bundling and extrusions. One approach for dealing with the problems associated with producing such superconductor wire is to utilize a routinely used triple extrusion technique with suitable modifications to avoid filament sausaging and coupling.

Figure 1:
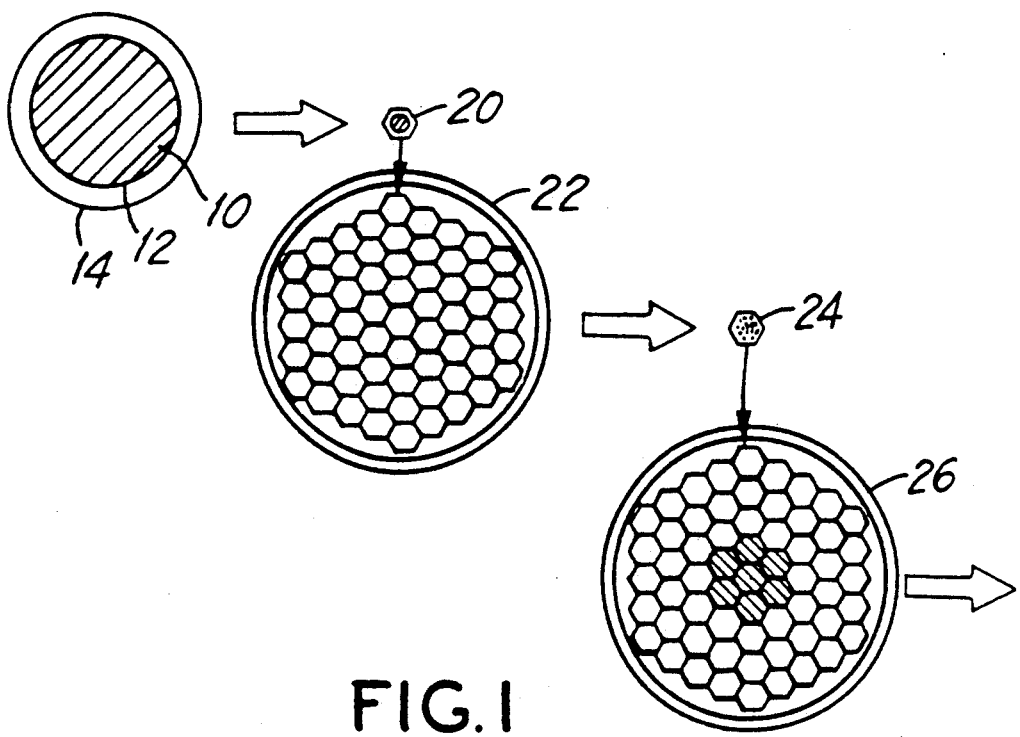
FIG. 1 shows a schematic representation of a routine triple extrusion method used in prior art processes for producing ultrafine multifilament superconductor wire.

The triple extrusion approach is shown schematically in FIG. 1. In this approach a number of extruded clad monofilament rods are bundled in two iterations to get the desired quantity of filaments.

The monofilament rods 10 are first extruded into hex shape rods 20, which are then assembled into an extrusion can 22, and this assembly again extruded and processed into a hex shaped subelement 24, several of which are assembled into a second extrusion can 26 and again extruded a final time, and subsequently drawn to a final desired size.

Although the three step process reduces overall yield and increases the process time, this method nevertheless becomes more and more attractive as the filament size gets smaller (below 3 microns).

The number of filaments in the second extrusion is an important consideration since the larger it is, the smaller is the fraction of filaments located on the outside ring of the subelement. The number of filaments used in the multifilament restack element in some early conductors was 7 and then 19 was tried. In these cases, 6/7 or 85% and 12/19 or 63% of the filaments, respectively, lie on the outside row of the pattern. These outside filaments having large amounts of copper on one side do not have the support like the interior ones. This resulted in relatively low "n" values in these conductors because of extensive filament sausaging. A domestic manufacturer OST, has tried 55 filaments where 24/55 or 43.6% of the filaments were unbounded. Another manufacturer, Furukawa, has tried 85 filaments where 30/85 or 35.3% of the filaments were unbounded. "n" values less than single extrusion multifilament conductors were also observed in these cases.

In this approach, it is contemplated that the use of a large number, such as 253, filaments in the second extrusion would result in 42/253 or only 16.5% of the filaments being unbounded. An interfilament matrix material, such as Cu-0.5wt% Mn or CuNi, is used to prevent electrical coupling of the filaments at the extremely small interfilament spacings that will be reached in the final product. When CuNi is used, its hardness will help maintain the filament uniformity because the strength of the CuNi is closer to that of NbTi than is Cu. This further constrains the outer ring of filaments in the MF restack element, yielding a more uniform sub-bundle in the final product. To provide further mechanical support to the outer rows of filaments in the second extrusion, harder can materials may be investigated. The final assembly should have a pure copper core and a copper jacket. This distribution of high RRR copper lends a fair degree of electrical and thermal stability to the conductor.

It has been shown that when a single stack (either hexagonal or round) approach is used, the attainable Jc and n values are high. If large numbers, in the order of tens of thousands, of filaments are involved, either hexagonal elements or round elements lead to extreme difficulties in billet assembly. Small hex rods tend to twist and bend, and round elements tend to dislodge from a perfect hexagonal close packed pattern thereby resulting in various forms of stacking imperfections. It should also be noted that round rods can be made with better straightness and more economically than hex rods.

To enable high rate, large scale fabrication of strands for SSC or other large application, the present invention provides for a novel hex cell billet design and an assembly technique that uses round rod elements. As shown schematically in FIG. 2, this approach consists of assembling a number of round monofilament rods in a hexagonal close packed (hcp) pattern inside thin hexagonal tubes which are then arranged inside an extrusion can. The straight walls of the hex tube will maintain a perfect hcp symmetry without any stacking faults. The hex tube material should be thin enough not to upset the local area ratio of the outer filaments and it should be strong enough to withstand handling during billet assembly. Some candidate materials for this are hard tempered pure copper, dilute but ductile alloys of copper or Ni such as CuNi or CuMn, or dispersion strengthened copper, for example, $Cu-Al_2O_3$. The stronger materials will impart further support to the outer rows of filaments and preclude local filament sausaging.

Besides maintaining a perfect hcp pattern in each hex cell, this method also provides a uniform arrangement of filaments across the entire assembly. This is not the case in the last stage billet assembly in a triple extrusion approach discussed earlier.

Not only can the hex cell approach of the present invention be used for large numbers of fine filaments (of the order of 3 microns or less) but it can be automated for large quantity billet fabrication. The automation approach could, for instance, take advantage of prepacking the hex-cells as subassemblies.

It is contemplated that the assembly approach of the present invention may be effectively utilized to assemble numbers of fine round monofilaments ranging from 3,000 to about 100,000, and preferentially will be used to assemble from about 6,000 to about 50,000 such monofilaments. Additionally, by first stacking the multifilament wires into the hex tube and then stacking a multiplicity of hex tubes into an outer can, can further be extended to provide a multitude of filamentary wire. Specifically, the outer cans, after extrusion can then be stacked again into yet a final outer can. Such intermediary cans can either be stacked into the final can in their round shape or can be extruded into a hex shape and then restacked into the final outer can.

Using the aforementioned process, this hex cell approach can be repeated to make conductors with millions of filaments. Such conductors would have utilization in the artificial pinning centers type wires as discussed in U.S. Pat. No. 4,803,310, entitled "Superconductors Having Controlled Laminar Pinning Centers, and Methods of Manufacturing Same".

The benefit of such multifilament wires is that it cuts down on the number of steps to produce such multifilament wire. The reason is that by using the hex cell approach, it cuts down on the number of extrusion steps required to produce a conductor with such large numbers of wires.

The assembled billets will be consolidated by techniques such as hot isostatic pressing (hip) to eliminate all the intersticial voids. Since each group of monofilaments are well contained in the hex tubes, the hcp structure is well preserved during the consolidation step.

Generally, from about 7 to 1,000 thin wall hex tubes will be utilized to form the hex cell subelements in carrying out the process of the present invention, and preferably from about 50 to about 500 such hex tubes will be employed.

Common to both the prior art triple extrusion process and the hex cell extrusion approach described above, are various state-of-the-art composite fabrication steps.

Significant process changes have evolved to produce ductile final size wire since early attempts at making 2 micron filaments in 1986. The use of diffusion barriers has been reasonably well established. Hot isostatic processing will be used to consolidate assembled billets prior to extrusion. The hipping is also expected to increase the bond at various interfaces. For example, with NbTi filaments, there are the NbTi/barrier, barrier/matrix and between restack elements. The cold worked state of the alloy in the final billet will be modified through heat treatment prior to extrusion to a state appropriate for processing the billet to final size wire, generally such temperatures will vary from about room temperature to about 600°-700°C. The extrusion temperature and reduction will be such that a high integrity well bonded composite will result.

The approach of the present invention is aimed at maintaining good filament quality, reduction of filament coupling and production of ductile conductors in long piece lengths through the steps mentioned above.

DESCRIPTION OF THE PREFERRED EMBODIMENTS

Figure 2:
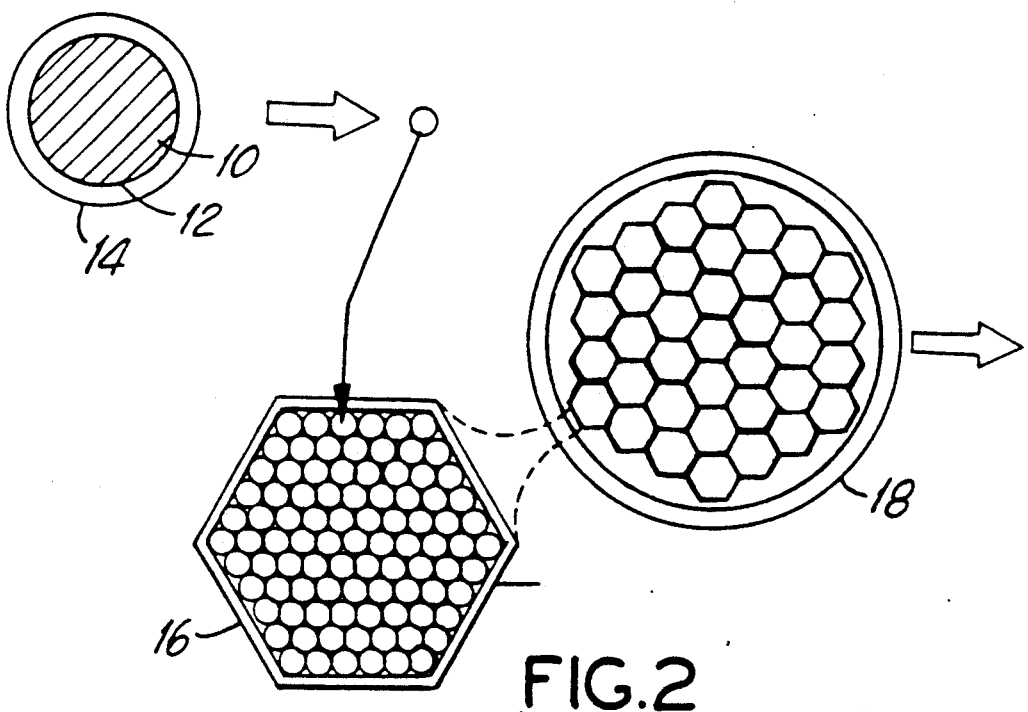
FIG. 2 shows a schematic representation of the hex cell extrusion method of the present invention.

In a preferred embodiment of the present invention, there is initially an assembled billet which is formed of a plurality of NbTi filaments or rods 10. Generally, the NbTi rods can be inserted directly. However, alternately, as shown, each can be clad with a barrier layer 12 and a Cu jacket 14. These rods are assembled together inside a number of thin wall hexagonal tubes 16, as shown in FIG. 2.

The barrier 12 can typically be Nb but can also be such other material as Ta, Ni, V, Zr, or combinations or alloys thereof.

Once assembled in the thin wall hexagonal tubes, a number of such hex tube subelements are arranged inside of an extrusion can or casing 18.

The entire assembly is then subjected to compaction, extrusion and drawing down to the desired size.

Figure 3:
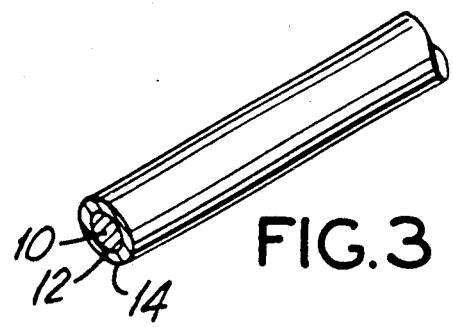
FIG. 3 shows an individual Cu jacketed NbTi rod with a barrier layer.

With reference to FIG. 3 a single round clad monofilament rod 10 is shown in perspective showing the barrier layer 12 and copper coating layer 14.

Figure 4:
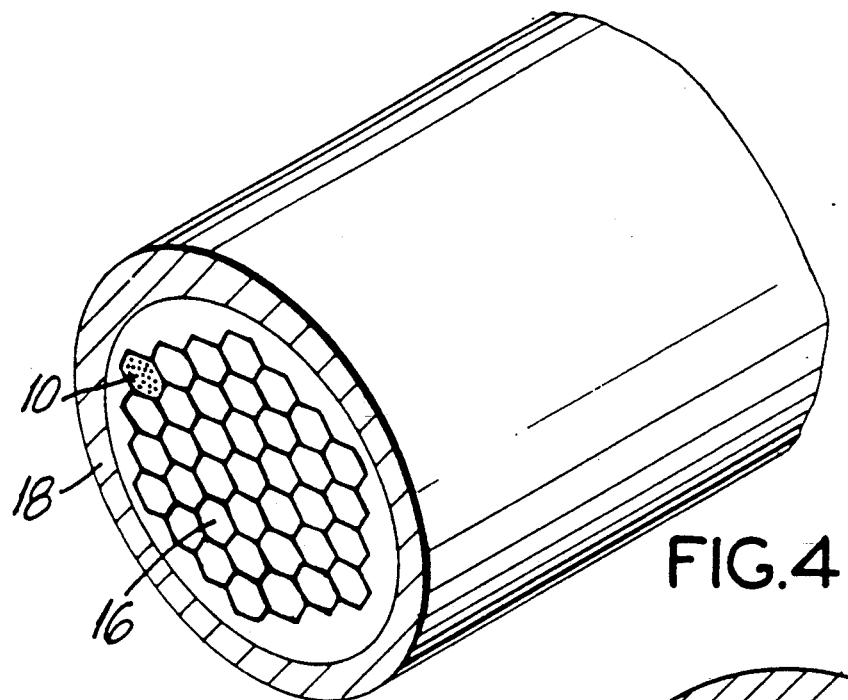
FIG. 4 shows a billet assembly with the rods of FIG. 2 inserted in a number of thin wall hexagonal tubes with these then inserted in an outer extrusion casing.

FIG. 4 depicts an assembled billet prior to extrusion, in perspective, showing a multiplicity of round clad monofilament rods 10 inserted into a multiplicity of thin wall hex tubes 16, all within an outer extrusion casing 18.

Figure 5:
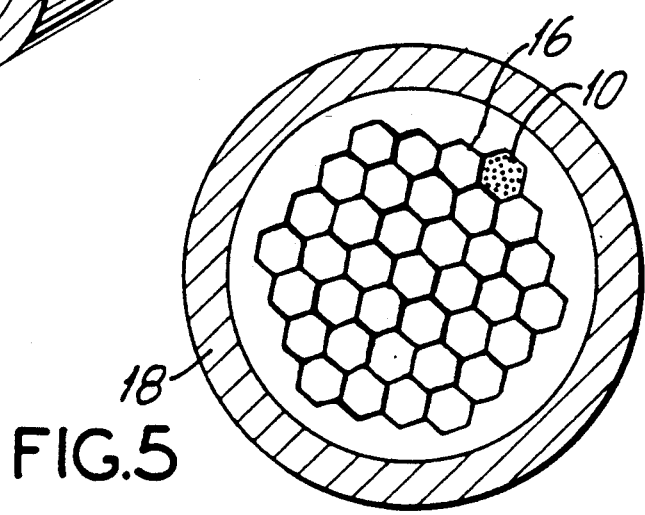
FIG. 5 shows a cross sectional view of the final wire after being drawn to its desired size.

FIG. 5 shows a cross-section of a compacted, extruded and drawn final wire wherein the multiplicity of monofilament rods 10, inside the multiplicity of hex tube subelements 16, all within the outer extrusion casing 18, have been preserved in a near perfect hexagonal close packed pattern.

In addition to starting with NbTi filaments, the individual rods can be alloys of such material including, by way of example, NbTiHf, NbTiTa, NbTiZr, and the like. Other such alloys of NbTi can likewise be utilized.

In addition to utilizing the method heretofore described in connection with the formation of NbTi wires, any type of multifilament superconductor wire can be formed. By way of example, referring now to FIG. 6, there will be described how the present invention can also be utilized to form a $Nb_3Sn$ type multifilament wire. Initially, single rods of copper clad Niobium rods are formed. The Niobium center 30 is encircled by the copper cladding 32. Without extruding, these are then packed into an outer hex shaped thin copper tube 34. These are then compacted into an outer can 36. The center of the can is filled with copper 38. Typically, barriers will be utilized, as is well known in the tin core process. After extrusion, the center can be drilled and a mandrill inserted into the center. Thereafter, tin will be inserted replacing the mandrill and thereafter final heat treatment will be achieved to cause the diffusion of the tin into the Niobium strands to form the Nb₃Sn multifilamentary wire.

While the formation of such Nb₃Sn type superconductors has been described in connection with the tin core process, such multifilamentary wires can also be formed in accordance with other processes.

Figure 6:
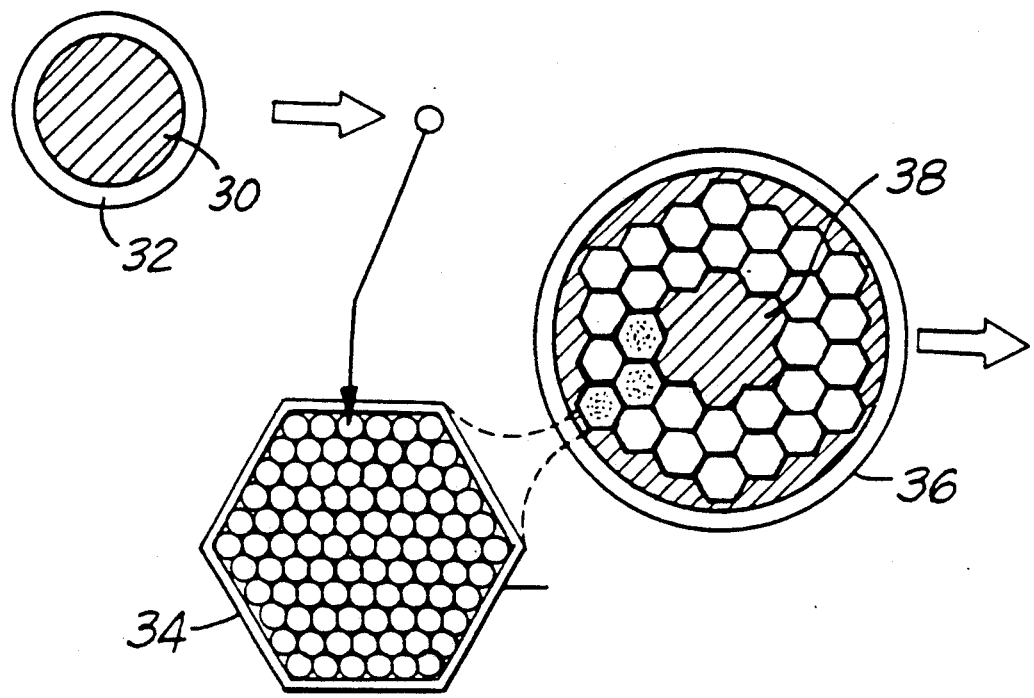
FIG. 6 shows a billet assembly with the rods of Nb to form an ultimate wire of Nb3Sn filaments.
Figures 7, 8:
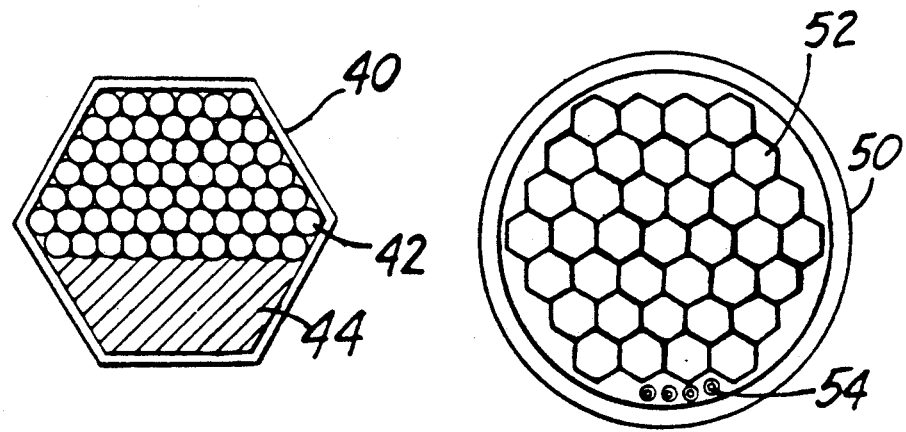
FIG. 7 shows a hex cell partially filled with monofilaments and the rest filled with a copper material.
FIG. 8 shows a cross sectional view of a can filled with hex cells and the periphery with monofilamentary wires.

Up until now, each of the thin walled hex tubes have been shown to be uniformly filled with the individual clad rods. However, those hex tubes which will be placed near the outer periphery of the final can may not be completely be filled with the monofilaments. As shown in FIG. 7, a typical outer hex tube 40 is shown with the individual clad monofilamentary wires 42 only occupying a portion of the tube. The lower part of the tube is shown filled with copper material 44. In this case, this particular tube would be used in the outer ring of hex tubes formed into a can 36 as shown in FIG. 6. Thereafter, when extruding and ultimately heat treating, the copper in the outer portion of the hex tube will merge with the copper matrix material in order to provide a closer approximation to a round shape of the wires within the outer can. This will give it an appearance closer to a conventional type wire where the wires are within a round periphery within the can.

Alternately, as shown in FIG. 8, when an outer can 50 is filled with the individual hex tubes 52, the peripheral space around the hex tubes can be filled with individual wires 54. Such wires can be individual copper wires, copper clad wires, or in the case of NbTi, monofilaments of such wire could be filled into the end.

As stated earlier, the benefits to be achieved by the method of the present invention derive from the advantages of assembling a large number of round monofilament rods in a hexagonal close packed pattern inside a thin wall hexagonal tube to make a subassembly which, when assembled along with a multiplicity of other such subassemblies within an extrusion can, allows one to preserve the near perfect hcp pattern in the final compacted, extruded and drawn wire product.

An inherent advantage in this approach is the ability to accommodate a large number of such monofilaments, i.e., up to as many as 100,000 or more monofilaments and still preserve the near perfect hcp pattern, while eliminating current density losses associated with necking and coupling effects and thus obtain a superior final product having an extremely large number of uniformly spaced, uncoupled monofilaments.

The use of a hex tube subassembly is significant to this process and such a hex tube subassembly is considered to be a novel product in its own right which has not heretofore been used in the manufacture of multistrand superconductor wire of the type described in the present invention.

Evaluations of sample billets assembled according to the process of the present invention as compared with other known approaches shows that:

Assembly of an outer SSC billet of approximately 4,200 filaments by the utilization of hexagonal monofilament stacking units may typically take three to four times as long as the hex cell approach of the present invention which uses round monofilament stacking units. The savings would be even more dramatic for filament numbers in excess of 8,000, (for example, 6-2.5 micron SSC type conductors) where a perfect matrix array can be achieved by the hex cell method of assembly in a small fraction of the time that it would take to otherwise single stack that many filaments and try to obtain a perfect array.

The hex cell subassembly method offers a feasible method for stacking monofilament rods with diameters as low as 0.049Δ; that is, approximately 40,000 filaments in a typical 12 inch billet and still achieve a perfect array. The feasibility of the hex cell method of assembly for fine stacking units makes it likely that 2.5 micron filaments in SSC type wire can be produced with a perfect array and in a relatively quick and economical manner.

It has been shown that a round starting shape for the monofilament rods can be manipulated to yield hexagonal or round shaped NbTi filaments or filaments of other material by the choice of appropriate processing parameters.

The general performance of the wire made from a billet formed using the method of the present invention has proven to be excellent.

While particular embodiments of the present invention have been shown, it will be obvious to those skilled in the art that changes and modifications may be made without departing from the invention in its broader aspects. Therefore, the aim in the appended claims is to cover all such changes and modifications within the true spirit and scope of the invention. The matter set forth in the foregoing description and drawings is offered by way of illustration only and should not be considered as limiting the invention in any way whatsoever. The actual scope of the invention is intended to be defined in the following claims, when viewed in their proper perspective based on the prior art.

I claim:

1. A process for preparing a superconductor wire comprising:

providing round filament rods;

placing a multiplicity of round filament rods inside of a thin wall hexagonal tube in a closed packed pattern to form thin wall hexagonal subassemblies each filled with said multiplicity of round filament rods;

arranging a number of the thin wall hexagonal subassemblies inside an extrusion can;

compacting the assembled extrusion can to a composite; and extruding the composite to the final size desired.

2. A process for assembling a superconductor wire according to claim 1, wherein said filament rods are monofilament rods.

3. A process for preparing a superconductor wire according to claim 2 wherein the round monofilament rods utilized are less than about 6 microns in diameter.

4. A process for preparing a superconductor wire according to claim 3 wherein the round monofilament rods are from about 2 to about 3 microns in diameter.

5. A process for preparing a superconductor wire according to claim 2 wherein the number of round monofilament rods utilized is from about 3,000 to about 100,000.

6. A process for preparing a superconductor wire according to claim 2 wherein the number of round monofilament rods utilized is from about 6,000 to about 50,000.

7. A process for assembling a superconductor wire according to claim 2 wherein the number of thin wall hexagonal tubes utilized is from about 7 to about 1,000.

8. A process for assembling a superconductor wire according to claim 2 wherein the number of thin wall hexagonal tubes utilized is from about 50 to about 500.

9. A process for assembling a superconductor wire according to claim 2 wherein the monofilaments are arranged in a hexagonal close packed pattern within each thin wall hexagonal tube.

10. A process for assembling a superconductor wire according to claim 2 wherein the monofilaments are clad monofilaments.

11. A process for assembling a superconductor wire according to claim 10 wherein the monofilaments are NbTi filaments, clad with a barrier layer and a Cu jacket.

12. A process for assembling a superconductor wire according to claim 11 wherein the barrier layer is selected from Nb, Ta, Ni, V and Zr.

13. A process for assembling a superconductor wire according to claim 1 wherein the round filament rods are multifilament rods.

14. A process for assembling a superconductor wire according to claim 10 wherein the monofilament cladding material is selected from Cu, Ni, Al, or alloys thereof.

15. A process for assembling a superconductor wire according to claim 2 wherein from about 6,000 to about 50,000 monofilaments are assembled in a hexagonal close packed pattern within each of about 50 to about 500 thin wall hex tubes, which hex tubes are then assembled within an extrusion can, consolidated, extruded at a temperature of from about 60° F. to about 1400° F. and drawn to the final desired size wire.

16. A process for assembling a superconductor wire according to claim 11, wherein said monofilaments are alloys of NbTi.

17. A process for assembling a superconductor wire according to claim 2, wherein the monofilaments are Nb or Nb alloy filaments clad with a Cu jacket.

18. A process for assembling a superconductor wire according to claim 2, wherein said thin wall hexagonal tube is formed of Cu, Ni or alloys thereof.

* * * * *